US 6,857,557 B2

(12) United States Patent
Hua

(10) Patent No.: US 6,857,557 B2
(45) Date of Patent: Feb. 22, 2005

(54) LOW TEMPERATURE MICROELECTRONIC DIE TO SUBSTRATE INTERCONNECTS

(75) Inventor: Fay Hua, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 25 days.

(21) Appl. No.: 10/326,564

(22) Filed: Dec. 20, 2002

(65) Prior Publication Data

US 2004/0118586 A1 Jun. 24, 2004

(51) Int. Cl.[7] .............................................. B23K 31/22
(52) U.S. Cl. ............................. 228/180.22; 228/234.1
(58) Field of Search .................... 228/180.22, 180.21, 228/234.1

(56) References Cited

U.S. PATENT DOCUMENTS

| | | | | |
|---|---|---|---|---|
| 5,147,084 A | * | 9/1992 | Behun et al. | 228/56.3 |
| 5,371,328 A | * | 12/1994 | Gutierrez et al. | 174/261 |
| 6,543,674 B2 | * | 4/2003 | Lee et al. | 228/180.22 |
| 6,546,620 B1 | * | 4/2003 | Juskey et al. | 29/840 |

OTHER PUBLICATIONS

"Advanced IC Interconnect . . . "; Shi Frank G.; Final Report '98–99 for MICRO Project 99–107; U of C, Irvine, CA.
"P–TSLP–2–1 / P–TSLP —3–1 . . . "; Internet publication; Infection Technologies AG; www.infineon.com; Germany; Dec. 20, 2002*.

"Packaging Assessment of Porous Ultra . . . "; Rasco et al.; International Sematech et al.; Dec. 20, 2002*.

* cited by examiner

Primary Examiner—Hung V. Ngo
(74) Attorney, Agent, or Firm—Schwabe, Williamson & Wyatt, P.C.

(57) ABSTRACT

Methods are provided for interconnecting two electronic components having surface mount technology interconnects. In one embodiment, a reflowable electrically conductive first interconnect material is reflowed onto the land pads of a microelectronic die. A reflowable electrically conductive second interconnect material is reflowed between the first interconnect material and corresponding bond pads of a carrier substrate at a temperature below the melting temperature of the first interconnect material. The gap between the microelectronic device and the carrier substrate is provided with underfill material. The first and second interconnect materials are reflowed at or above the reflow temperature of the first interconnect material creating a hybrid material having a melting temperature higher than the second interconnect material. The interconnections take place at various stages of microelectronic device and package fabrication at various temperatures to minimize the detrimental effects of thermal and structural loading in the land pad region.

26 Claims, 4 Drawing Sheets

LOW TEMPERATURE MICROELECTRONIC DIE TO SUBSTRATE INTERCONNECTS

FIELD OF THE INVENTION

The present invention relates to microelectronic assemblies and, more particularly, to surface mount technology interconnect methods to facilitate reliable high-performance and high-density component interconnection.

BACKGROUND OF INVENTION

In the following description, reference is made to microelectronic die, carrier substrate, microelectronic device, and microelectronic package. A microelectronic die comprises a die substrate upon which microcircuits are formed. Examples of die substrates include, among others, wafers comprising silicon (Si), gallium arsenide (GaAs), Indium Phosphate (InP) and their derivations. Various techniques are used, such as layering, doping, masking, and etching, to build thousands and even millions of microscopic integrated circuit (IC) devices in the form of transistors, resistors, and others, on the microelectronic die. The IC devices are interconnected to define a specific electronic circuit that performs a specific function, such as the function of a microprocessor or a computer memory.

A microelectronic device is defined as a microelectronic die electrically interconnected with a carrier substrate. A carrier substrate is a structure comprising conductive pathways through which microcircuits of the microelectronic die communicate with external components. A microelectronic package is defined as a microelectronic device that is assembled into a finished package with additional components, such as electrical interconnects, a die lid, and a heat dissipation device, among others. An example of a microelectronic package includes, but is not limited to, a flip-chip ball grid array (FC-BGA) microprocessor package.

The surface of the microelectronic die that comprises the active circuitry includes one or more alternating dielectric and conductive layers. The dielectric layers are also known as passivation layers or interlayer dielectric (ILD) layers. The ILD layers electrically insulate the active circuitry from electrical shorts, but also, along with the conductive layers, define electrical communication paths terminating with land pads on the surface of the microelectronic die. The land pads provide a conductive surface upon which electrical interconnections can be made with bond pads of similar design located on the carrier substrate. A reflowable electrically conductive interconnect material is used to interconnect the land pads with the bond pads in a process commonly known as a reflow process or a controlled collapse chip connection (C4) process.

FIG. 1 is a cross sectional view of a representation of a microelectronic die 8 in the land pad region 9, comprising a die substrate 10, multiple conductive layers 14, 18, 22, ILD layers 12, 16, 20, and vias 25 that define conductive paths from a circuit on the die substrate 10 to a land pad 24 at the surface of the microelectronic die 8. The representation is not drawn to scale as the conductive and dielectric layers are exceedingly thin.

As the drive for smaller and thinner microelectronic packaging continues, materials having a low dielectric constant (k) that can be made very thin are being investigated for use as ILD material. An ILD having a lower k can be made thinner for the same performance as one that is thicker with a higher k.

Materials having a lower k tend to be structurally weak. Low k materials currently being evaluated include, among others, in order of hardness: SiO2 with a hardness of 10 GPa, SiOF with a hardness of 8.5 GPa, and carbon doped oxide (CDO) having a hardness of 2 GPa. New ultra low-k materials are approaching dielectric constants as low as k=2. One approach to providing a low-k material is to provide a material with a high pore volume. Unfortunately, as the pore volume is raised, the mechanical properties deteriorate. Many of the issues related to these mechanical properties do not necessarily show up during microelectronic die 8 manufacturing, but do arise as the microelectronic die 8 is packaged, because the packaging itself is mechanically the most challenging process.

The process used to interconnect the land pad 24 of a microelectronic die 8 and the bond pad of a carrier substrate (not shown), induces significant stress in the land pad region 9 in and around the land pad 24. The materials used for the interconnect material 30, the land pad 24, the ILD layers 12, 16, 20 and the conductive layers 12, 16, 22 each have a different coefficient of thermal expansion (CTE) and therefore, each expand and contract at different rates during thermal loading. The packaging process involves many thermal cycles, each of which can cause interlayer delamination and cracking failure due to the mismatch of CTE.

In addition to the CTE mismatch, the land pad region 9 encounters additional forces caused by the dynamics of the interconnect material 30 during the reflow process. Factors inducing these forces include, but are not limited to, the molten interconnect material 30 supporting the weight of the microelectronic die 8 during the reflow process (see FIG. 3), and the adhesion of the interconnect material 30 on the land pad 24. These forces tend to add additional stress to an already stressed laminate structure of the land pad region 9, including the ILD layer 12, 16, 22, due to the CTE mismatch, potentially causing cracking and delamination failure.

As an illustration of the potential for structural failure of the land pad region 9, a microelectronic die having the low-k material carbon doped oxide (CDO) for the ILD material was interconnected with a carrier substrate using eutectic Sn—Ag interconnect material. A commonly used reflow temperature of 230–235 C was used to interconnect copper land pads to copper bond pads with the Sn—Ag interconnect material. The stress induced at the interconnect and within the ILD material as a consequence of the reflow process caused cracking and delamination failure at the ILD and conductive layers.

For the reasons stated above, and for other reasons stated below which will become apparent to those skilled in the art upon reading and understanding the present specification, there is a significant need in the art for methods for interconnecting microelectronic die and carrier substrate that address the limitations and undesirable characteristics associate with the low-k ILD materials.

DESCRIPTION

In the following detailed description, reference is made to the accompanying drawings which form a part hereof wherein like numerals designate like parts throughout, and in which is shown by way of illustration specific embodiments in which the invention may be practiced. Embodiments involving the interconnection between specific electrical components, such as microelectronic die and carrier substrate, are set forth in order to provide a thorough understanding of the present invention. It is to be understood that other electrical components may be utilized and structural or logical changes may be made without departing from the scope of the present invention. Examples of other electrical components suitable for the interconnect methods of the present inventions include, but are not limited to, microelectronic packages, system substrates, and mother boards.

It is also understood that similar interconnections, not necessarily electrical interconnections, to those presented in the detailed description can benefit from the methods of the present invention. An example of an interconnection not necessarily electrical, is a thermally conductive interconnection. It is known in the art that electrical as well as thermal conductive paths can be found in the components of microelectronic packaging. The interconnect methods of the present invention provide similar benefits for thermal interconnects as well as electrical interconnects, and are not limited thereto.

Embodiments of the methods in accordance with the present invention provide an interconnection process wherein in one stage of a method a first interconnect material having a high reflow temperature and a second interconnect material having a lower reflow temperature are interconnected by reflowing only the second interconnect material. Diffusion takes place at the interface between the first and second interconnect materials depending on subsequent thermal cycling processes. In another stage of a method, a process at the reflow temperature of the first interconnect material provides for an intermixing of the first and second interconnect material to effect a homogenous alloy having a higher melting temperature than the second interconnect material. The interconnections take place at various stages of microelectronic device fabrication and at various temperatures to minimize the detrimental effects of thermal and structural loading in the land pad regions.

Figure 2A:
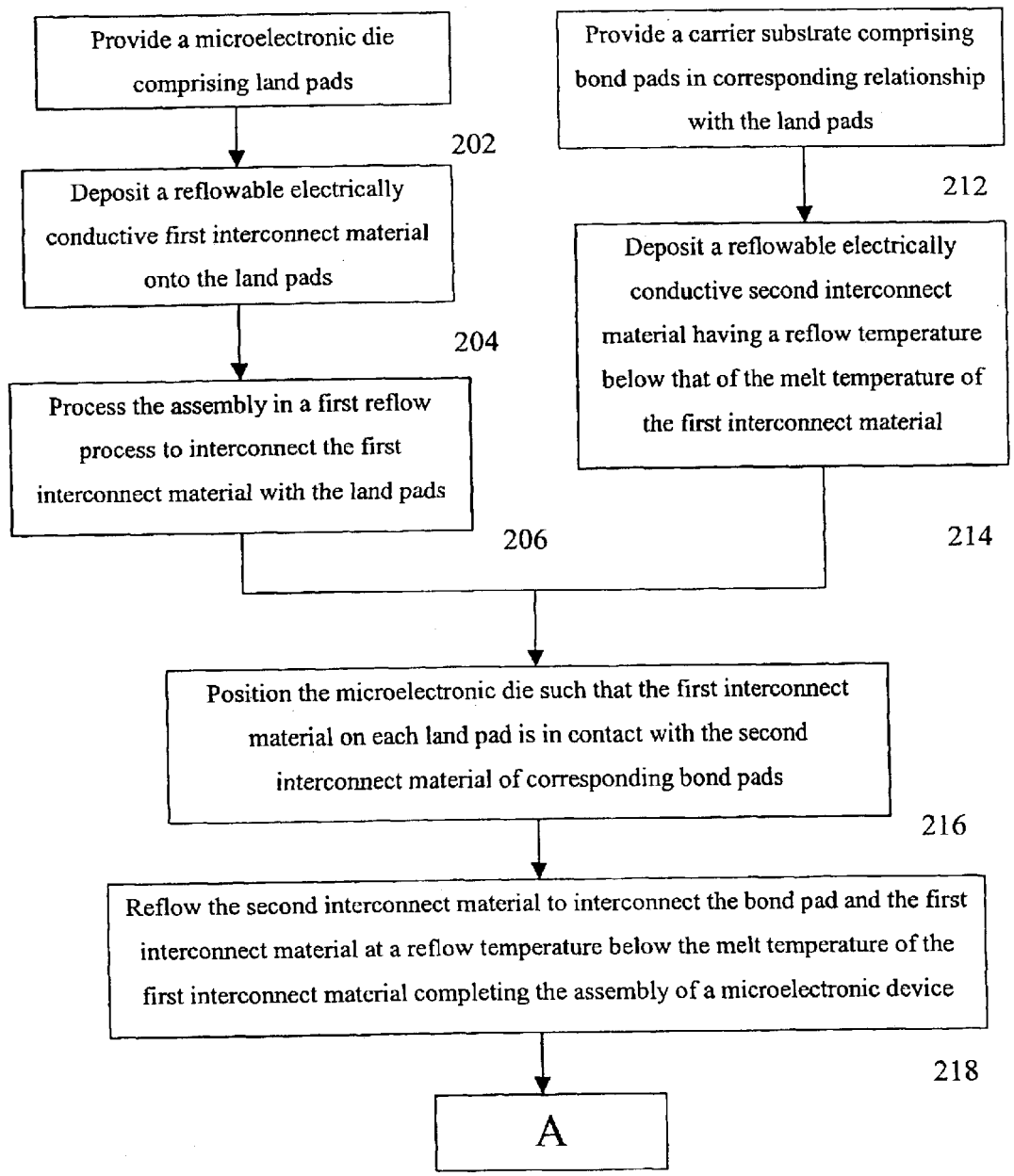
FIGS. 2A and 2B are flow charts of methods of microelectronic die to carrier substrate attachment, in accordance with the present invention.

FIG. 2A is a flow diagram of a method for providing an electrical interconnection between a land pad of a microelectronic die and a bond pad of a carrier substrate, in accordance with an embodiment of the invention. A microelectronic die comprising electrical interconnects in the form of land pad is provided 202. A reflowable electrically conductive first interconnect material is deposited onto the land pads 204. A first reflow process is used to interconnect the first interconnect material with the land pads 206, the first interconnect material taking a smooth rounded form due to surface tension when molten.

A carrier substrate comprising electrical interconnects in the form of bond pads in corresponding relationship with the land pads is provided 212. A reflowable electrically conductive second interconnect material having a reflow temperature below that of the melt temperature of the first interconnect material is deposited on the bond pads 214. The microelectronic die is positioned such that the first interconnect material on each land pad is in contact with the second interconnect material of corresponding bond pads 216. A second reflow process is used to interconnect the second interconnect material with both the bond pad and the first interconnect material at a reflow temperature below the melt temperature of the first interconnect material 218. The second interconnect material reflows to conform to the first interconnect material and the bond pad, the first interconnect material remaining in a solid state. Upon cooling, an interconnection between the land pads and the bond pads is formed completing the assembly of a microelectronic device.

The microelectronic device, at this point of manufacture, can be used in microelectronic packaging wherein further thermal cycling is conducted at temperatures below the melt temperature of the first interconnect material. The benefits of the high temperature, low stress interconnection between the first interconnect material and the land pad of the microelectronic die will be realized. One such benefit includes, but is not limited to, that additional stress at the land pad region comprising ILD layers is reduced as there will be no further reflow of the first interconnect material.

Figure 2B:
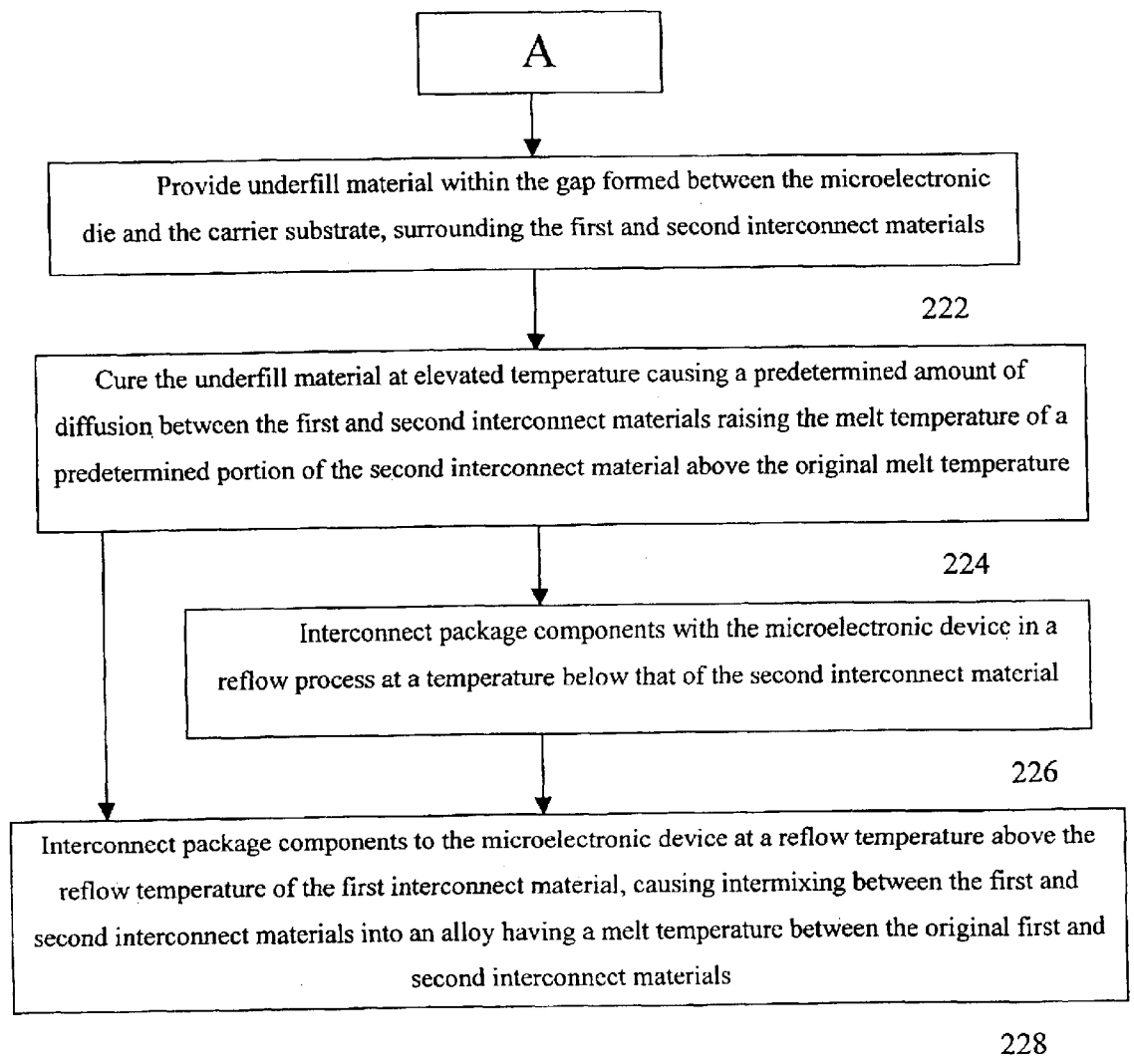

In a more likely situation, the microelectronic device will encounter a reflow process or other thermal cycling above the melt temperature of the first interconnect material. FIG. 2B is a flow diagram of a method for providing an electrical interconnection between a land pad of a microelectronic die and a bond pad of a carrier substrate, wherein the microelectronic device is processed further into a microelectronic package, in accordance with another embodiment of the invention. A microelectronic device is provided in accordance with the embodiment of FIG. 2A 118. Underfill material is provided within the gap formed between the microelectronic die and the carrier substrate, surrounding the first and second interconnect materials 222. The underfill material is cured at elevated temperature causing a predetermined amount of diffusion between the first and second interconnect materials raising the melt temperature of a predetermined portion of the second interconnect material above the original melt temperature 224. Package components are interconnected with the microelectronic device in a reflow process at a temperature below that of the second interconnect material 226 and/or additional package components are interconnected to the microelectronic device at a reflow temperature above the reflow temperature of the first interconnect material, intermixing the first and second interconnect materials into an alloy having a melt temperature between the original first and second interconnect materials 228.

Figure 3A:
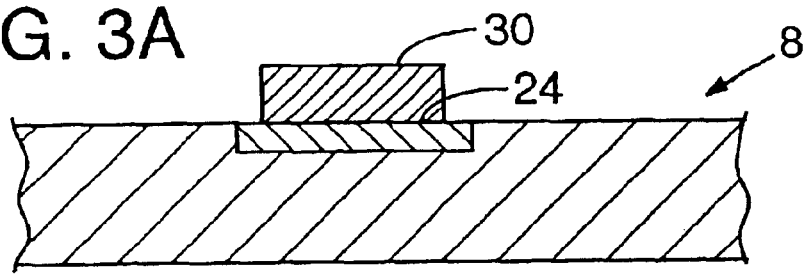
FIG. 3A and FIG. 3B are cross-sectional views of a microelectronic die with interconnect material before and after a reflow process, in accordance with an embodiment of the invention.
Figure 3B:
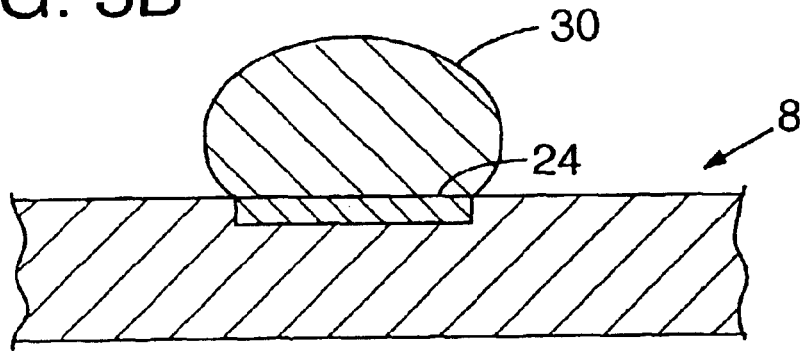

FIG. 3A is a cross-sectional view of the microelectronic die 8 after the application of the first interconnect material 30. FIG. 3B is a cross-sectional view of the microelectronic die 8 illustrating the first interconnect material 30 after the first reflow process. The first reflow process comprises heating the assembly to a temperature wherein the first interconnect material 30 melts and, due to surface tension, flows to conform to the die land pad 24 and into a generally rounded shape due to surface tension, and forming an integral electrical interconnection therewith upon cooling.

Figure 1:
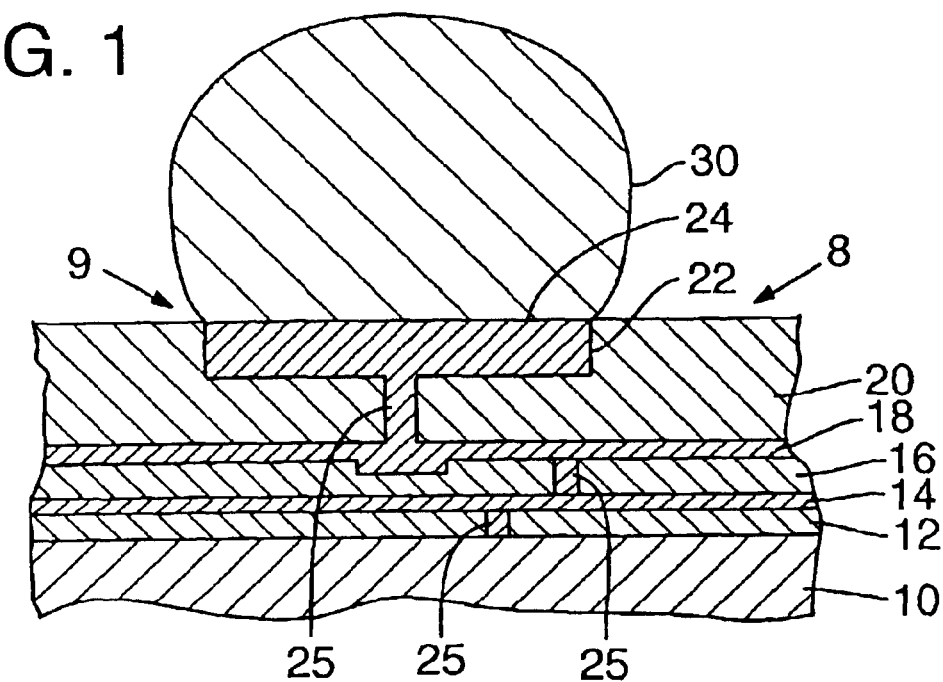
FIG. 1 is a cross sectional view of a representation of a microelectronic die in the region of a land pad.

The first reflow process establishes the interconnection between the first interconnect material 30 and the land pad 24. During thermal cycling to the first interconnect material 30 reflow temperature, the laminate structure at the land pad region 9, including the ILD layers (shown in FIG. 1), is placed under stress due to the mismatch of the CTE of the various materials. Since the first reflow process is performed separate from the second process to interconnect the bond pads of the carrier substrate with the land pads 24, the land pad region 9 is not presented with the additional stresses caused by the carrier substrate. The potential for delamination at the land pad region 9 is reduced.

Figure 4:
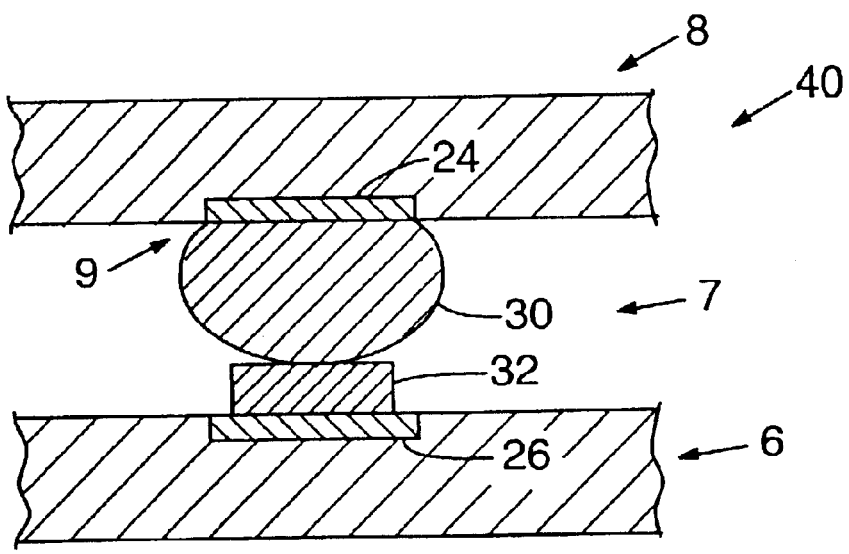
FIG. 4 is a cross-sectional view of a microelectronic die to carrier substrate interconnect prior to a reflow process, in accordance with an embodiment of the invention.

FIG. 4 is a cross-sectional view of a microelectronic die 8 to carrier substrate 6 interconnect prior to a reflow process, in accordance with an embodiment of the invention. Following the first reflow process, each land pad 24 is aligned with a corresponding bond pad 26 such that the first interconnect material is positioned and in contact with the second interconnect material 32 on the carrier substrate bond pad 26.

Figure 5:
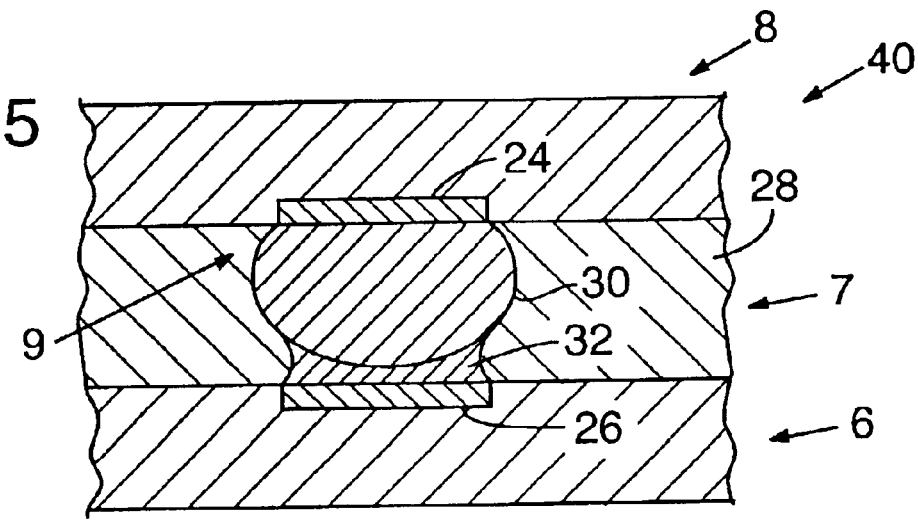
FIG. 5 is a cross-sectional view of a microelectronic die to carrier substrate interconnect subsequent to reflowing one of the interconnect materials, in accordance with an embodiment of the invention.
Figure 6:
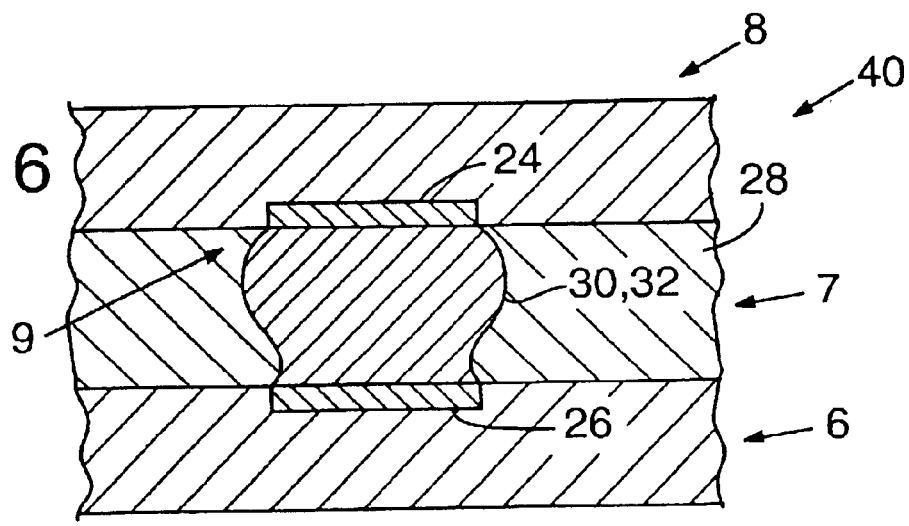
FIG. 6 is a is a cross-sectional view of a microelectronic die to carrier substrate interconnect subsequent to reflowing both of the interconnect materials, in accordance with an embodiment of the invention.

FIG. 5 is a cross-sectional view of a microelectronic die 8 to carrier substrate 6 interconnect subsequent to the second reflow process, in accordance with an embodiment of the invention. The assembly is reflow processed such that the second interconnect material 32 undergoes reflow while the first interconnect material 30 remains solid. The second interconnect material 32 forms an electrical interconnection with the carrier substrate bond pad 26 and the first interconnect material 30 upon cooling.

The second reflow process establishes the interconnection between the first interconnect material 30 and the bond pad 26 with the second interconnect material 32. Since the second reflow process is performed at a lower temperature, the stress caused by CTE mismatch at the land pad region 9, including the ILD layers (shown in FIG. 1), is reduced. Further, the solid first interconnect material 30 supports and reinforces the land pad region 9, reducing the stress. The potential for delamination at the land pad region 9 is thus reduced.

In accordance with the embodiments of the present invention, a first electrically conductive interconnect material 30 having a higher melt temperature than the reflow temperature of the second electrically conductive interconnect material 32 is required. An interconnect material commonly used in reflow processes, and which is suitable for use in accordance with the embodiments of the invention, is a tin-based solder comprising 37% lead (Sn/37Pb solder) having a melt temperature of 183 C A typical reflow temperature for Sn/37Pb solder is 205 C.

Other interconnect materials suitable for the particular purpose include, but are not limited to, lead-free, tin-based solder of 3.5% silver (Sn/3.5Ag solder) with a melt temperature of 221 C and a reflow temperature of 240 C, and lead-free, tin-based solder having 5% antimony (Sn/5Sb solder) with a melt temperature of 234 C and a reflow temperature of 255 C.

The first reflowable electrically conductive interconnect material 30 must remain in solid form during the reflow process used to interconnect the carrier substrate 6 to the microelectronic die 8. One can appreciate that since the first interconnect material 30 remains solid, the first interconnect material 30 provides a spacing structure to ensure a consistent predetermined standoff distance between the carrier substrate 6 and the microelectronic die 8. This consistent standoff distance provides for consistent underfill operations utilizing the capillary action of two closely spaced objects to draw in the fluid underfill material 28. This consistent standoff distance, or gap, provides for the possibility of having a smaller gap than would be possible with variable and unpredictable gaps encountered using standard unsupported interconnecting techniques. In addition, stresses caused by possible interconnect material collapse during reflow is minimized.

During the second reflow process, depending on the temperature, time at temperature, and pressure, diffusion will take place in the contact region between the first and second interconnect materials 30, 32. Diffusion is the exchange of atoms between two metallic materials in contact, the exchange providing a hybrid alloy material at the contact region. For two interconnect materials having different melt temperatures, the area of diffusion will, for many materials, have a melt temperature that is between the melt temperature of the two materials. Diffusion is well known in the metallurgical arts and therefore is not explained in detail here. The benefits of diffusion will be further discussed below by way of examples.

During the packaging of the microelectronic device 40 into a microelectronic package, underfill material 28 is provided and cured within the gap 7 between the microelectronic die 8 and the carrier substrate 6, surrounding the first and second interconnect materials 30, 32. The process of applying underfill material 28 to the gap 7 is well known. The underfill material 28, after cure, helps to prevent loading on the first and second interconnect materials 30, 32 during thermal cycling by supporting the microelectronic die 8 and the carrier substrate 6. Further, the detrimental effects of the collapse of the first and second interconnect materials 30, 32 and non-uniform standoff between the microelectronic die 8 and the carrier substrate 6 is prevented. The underfill material 28 also prevents the migration of the first and second interconnect materials 30, 32 away from the land pads 24 and the bond pads 26, respectively, during subsequent reflow processing.

In one embodiment in accordance with the methods of the present invention, the underfill process involves thermal processing to cure the underfill material 28. The thermal cycling induces a predetermined amount of additional diffusion between the first and second interconnect materials 30, 32.

Diffusion occurs during the various thermal processes following the interconnection of the second interconnect material 32 with the first interconnect material 30, as well as, in other embodiments of the methods, a dedicated thermal process to tailor the diffusion characteristics to suit a particular purpose. The study of diffusion involves the analysis of the phase diagrams of each element; the characteristics of two metallic compounds at various temperatures, quantities (ratios), and thermal rates. Careful consideration of temperature rise time, time at temperature, and temperature cooling rate all control the resulting metallurgical composition. The intermixing of incompatible materials or inappropriate processing parameters can result in the formation of intermetallics; crystal structures that are brittle and would be compromising to the interconnection. One in the metallurgical arts would recognize the proper conditions required for intermixing the first and second interconnect materials 30, 32.

The hybrid material formed by the first and second interconnect materials 30, 32, in accordance with the invention, will have the characteristic of a higher melting temperature than that of the second interconnect material 32. This provides that subsequent reflow processes using the second interconnect material 32 will not reflow the hybrid material. This will improve the reliability of the interconnection.

Microelectronic packaging components, such as a die lid, heat spreader and ball or pin grid arrays are assembled onto the microelectronic device 40 to produce the complete microelectronic package. The production of the microelectronic packaging components involves additional reflow processes to interconnect the various components. At least one of the reflow processes is at a reflow temperature at or above the reflow temperature of the first interconnect material 30.

In another embodiment, the microelectronic device with underfill material undergoes a dedicated reflow process at the reflow temperature of at or above the reflow temperature of the first interconnect material 30.

During the reflow process at or above the reflow temperature of the first interconnect material 30, both the first and second interconnect materials 30, 32 become molten and intermix. The microelectronic die and the carrier substrate are supported by the underfill such that no additional stress above that caused by the mismatch of CTE is introduced at the land pad region 9, including the ILD layers (shown in FIG. 1). The first and second interconnect materials 30, 32 intermix and homogenize to form a hybrid interconnect material having a melt temperature between the first and second interconnect materials 30, 32. A number of methods can be used to deposit the first interconnect material on the die land pads 24 and the second interconnect material 32 onto the carrier substrate bond pads 26. The methods include, but are not limited to, printing, plating, ion/chemical/vapor deposition, dispensing, and placement. For example, interconnect material 30, 32 in the form of paste can be silk-screened or dispensed through a needle-type applicator. A pat of solid interconnect material 30, 32 can be placed with a pick and place machine. The method of depositing the first and second interconnect materials 30, 32 will depend on the specific configuration of the system.

A number of candidate first and second interconnect materials were studied to determine the effectiveness of the methods as practiced in accordance with embodiments of the present invention. Tin (Sn) has a relatively high melt and reflow temperature, 232 C and 240 C, respectively. Tin is relatively more compliant than copper (Cu) and eutectic Sn—Ag, a common solder. Increased compliance reduces the potential for stress concentrations and buildup, which helps to prevent structural failure in the land pad region 9, including the ILD layers (shown in FIG. 1). Other high temperature materials suitable for the first interconnect material includes Sn—Cu, Sn—Ag, and Sn—Ag—Cu.

Eutectic Sn—In has a relatively low reflow temperature of 180 C The use of eutectic Sn—In in place of Sn—Ag, which requires a reflow temperature of 230–235 C, is calculated to reduce the stresses due to CTE mismatch by up to 50%.

In an embodiment in accordance with the invention, Sn is deposited on the land pad 24 to have a reflow height of 55 μm. Eutectic Sn—In is deposited on the bond pad 26 to have a reflow height of 20 μm. The Sn has a melting temperature of 232 C and eutectic Sn—In has a melting temperature of 118 C A reflow temperature of 180 C is used to interconnect the solid Sn on the land pad 24 with the molten Sn—In on the bond pad. The gap between the microelectronic die 8 and the carrier substrate is filled with underfill material 28. The microelectronic device 40 is subjected to a reflow process to attach the integrated heat sink, at a temperature of 170 C. During the reflow process, diffusion of Indium (In) into the Sn will take place, raising the melting temperature of the Sn—In alloy. Ball grid array attachment at a temperature of 240 C will reflow the Sn and Sn—In to intermix and solidify as an alloy having a higher melting temperature than the original Sn-35In. The resulting alloy has a melting temperature above 200 C, which will not reflow in subsequent package reflow processes at temperatures below 200 C.

In another embodiment in accordance with the invention, Sn is deposited on the land pad 24 to have a reflow height of 55 μm. Sn-40Bi is deposited on the bond pad 26 to have a reflow height of 20 μm. The Sn-40Bi is reflowed at 180 C to interconnect the Sn on the land pad 24 with the molten Sn-40Bi on the bond pad. The gap between the microelectronic die 8 and the carrier substrate is filled with underfill material 28. The microelectronic device 40 is subjected to a reflow process to attach the integrated heat sink, at a temperature of 170 C. During the reflow process, diffusion of Indium into the Sn will take place, raising the melting temperature of the Sn—Bi alloy. Ball grid array attachment at a temperature of 240 C will reflow the Sn and Sn—Bi to intermix and solidify as an alloy having a higher melting temperature than the original Sn-40Bi. The resulting alloy has a melting temperature above 200 C, which will not reflow in subsequent package reflow processes at temperatures below 200 C.

The methods of providing electrical interconnections using two different reflow temperature interconnect materials, in accordance with the embodiments of the invention, can be utilized in many applications which require the interconnection of surface mount technology (SMT) electrical components with another. Examples of SMT electrical components that would benefit from the methods include, but are not limited to, microprocessors or microcontrollers, memory devices, application specific integrated circuits (ASIC), digital signal processors (DSP), radio frequency circuits, amplifiers, power converters, filters, clocking circuits, passive elements such as inductors, capacitors, and resistors, and the like. Examples of electrical assemblies that can take advantage of the benefits of an interconnection comprising two different reflow temperature interconnect materials made in accordance with the present invention, include, but are not limited to, integrated circuit packages and semiconductor device packages.

In other embodiments in accordance with the present invention, the microelectronic device 40 comprising a microelectronic die 8 and a carrier substrate 6 incorporating interconnections comprising two different reflow temperature interconnect materials, in accordance with the present invention, is a component of an electrical system. An electrical system is broadly defined herein as any product comprising an electrical assembly. Examples of electrical systems include, but are not limited to, computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, etc.), and the like.

It is understood and appreciated that a microelectronic device 40 comprising a SMT electrical component 8 and a carrier substrate 6 incorporating interconnections comprising two interconnect materials having two different reflow temperatures may not necessarily be used exclusively for electrical communication between SMT electrical components. Interconnections comprising two different reflow temperature interconnect materials can also be utilized, for example, but not limited to, as an interconnect between a substrate and a heatsink for thermal dissipation. Therefore, the apparatus and methods for interconnections comprising two interconnect materials having two different reflow temperatures involving other than electrical interconnections, is also within the scope of the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for interconnecting electronic components, comprising:
    providing a first component having a plurality of first bond pad;
    providing a second component having a plurality of second bond pad in complimentary relationship to the first bond pads;
    depositing a reflowable electrically conductive first interconnect material onto each first bond pad;
    reflowing the first interconnect material onto the first bond pad;
    depositing a reflowable electrically conductive second interconnect material onto each second bond pad, the second interconnect material having a reflow temperature below the melting temperature of the first interconnect material;
    positioning the first interconnect material of each first bond pad onto the second interconnect material of corresponding second bond pads; and
    reflowing the second interconnect material at a temperature below the melt temperature of the first interconnect material.

2. The method for interconnecting electronic components of claim 1, further comprising:
    applying underfill material into the gap between the first and second component surrounding the first and second interconnect materials with the underfill material; and
    reflowing the first and second interconnect materials to effect intermixing to form a hybrid material having a higher melting temperature than that of the second interconnect material, the hybrid material interconnecting the first and second components.

3. The method for interconnecting electronic components of claim 2, wherein applying underfill material into the gap between the first and second component surrounding the first and second interconnect materials with the underfill material comprises applying underfill material into the gap between the first and second component surrounding the first and second interconnect materials with the underfill material and curing the underfill material at a temperature to effect a predetermined amount of diffusion between the first and second interconnect materials to effect a change in the melting temperature of a predetermined portion of the second interconnect material.

4. The method for interconnecting electronic components of claim 2, further comprising:
    processing the first and second interconnect materials in a thermal environment to effect a predetermined amount of diffusion between the first and second interconnect materials to effect a change in the melting temperature of a predetermined portion of the second interconnect material.

5. The method for interconnecting electronic components of claim 2, further comprising:
    reflowing the first and second interconnect materials to effect intermixing to form a hybrid material having a higher melting temperature than that of the second interconnect material, the hybrid material interconnecting the first and second components.

6. The method for interconnecting electronic components of claim 1, further comprising:
    processing the first and second interconnect materials in a thermal environment to effect a predetermined amount of diffusion between the first and second interconnect materials to effect a change in the melting temperature of a predetermined portion of the second interconnect material.

7. The method for interconnecting electronic components of claim 1, wherein providing a first component having a plurality of first bond pad comprises providing a microelectronic die having a plurality of land pad; and wherein providing a second component having a plurality of second bond pad comprises providing a carrier substrate having a plurality of corresponding bond pads.

8. The method for interconnecting electronic components of claim 7, wherein depositing a reflowable electrically conductive first interconnect material comprises depositing Sn on the land pads having a reflow height of 55 $\mu$m, and wherein depositing a reflowable electrically conductive second interconnect material comprises depositing Sn-35In on the bond pads having a reflow height of 20 $\mu$m; and wherein reflowing the second interconnect material at a temperature below the melt temperature of the first interconnect material comprises reflowing the second interconnect material at 180 C.

9. The method for interconnecting electronic components of claim 7, wherein depositing a reflowable electrically conductive first interconnect material comprises depositing Sn on the land pads having a reflow height of 55 $\mu$m, and wherein depositing a reflowable electrically conductive second interconnect material comprises depositing Sn-40Bi on the bond pads having a reflow height of 20 $\mu$m; and wherein reflowing the second interconnect material at a temperature below the melt temperature of the first interconnect material comprises reflowing the second interconnect material at 180 C.

10. The method for interconnecting electronic components of claim 1, wherein depositing a reflowable electrically conductive first interconnect material comprises depositing a material selected from the group consisting of: Sn-3.5Ag, Sn-5Sb, Sn—Cu, and Sn—Ag—Cu.

11. The method for interconnecting electronic components of claim 1, wherein depositing a reflowable electrically conductive second interconnect material comprises depositing a material selected from the group consisting of: Sn-35In and Sn-40Bi.

12. A method for interconnecting a microelectronic die and carrier substrate, comprising:
    depositing a reflowable electrically conductive first interconnect material onto each land pad of the microelectronic die;
    reflowing the first interconnect material onto the first land pads;
    depositing a reflowable electrically conductive second interconnect material onto each bond pad of the carrier substrate, the second interconnect material having a reflow temperature below the melting temperature of the first interconnect material;

positioning the first interconnect material of each land pad onto the second interconnect material of corresponding bond pads; and reflowing the second interconnect material at a temperature below the melt temperature of the first interconnect material.

13. The method for interconnecting a microelectronic die and carrier substrate of claim 12, further comprising:

applying underfill material into the gap between the microelectronic die and the carrier substrate surrounding the first and second interconnect materials with the underfill material; and reflowing the first and second interconnect materials to effect intermixing to form a hybrid material having a higher melting temperature than that of the second interconnect material, the hybrid material interconnecting the microelectronic die and the carrier substrate.

14. The method for interconnecting a microelectronic die and carrier substrate of claim 13, further comprising:

processing the first and second interconnect materials in a thermal environment to effect a predetermined amount of diffusion between the first and second interconnect materials to effect a change in the melting temperature of a predetermined portion of the second interconnect material.

15. The method for interconnecting a microelectronic die and carrier substrate of claim 13, further comprising:

reflowing the first and second interconnect materials to effect intermixing to form a hybrid material having a higher melting temperature than that of the second interconnect material, the hybrid material interconnecting the first and second components.

16. The method for interconnecting a microelectronic die and carrier substrate of claim 12, further comprising:

processing the first and second interconnect materials in a thermal environment to effect a predetermined amount of diffusion between the first and second interconnect materials to effect a change in the melting temperature of a predetermined portion of the second interconnect material.

17. The method for interconnecting a microelectronic die and carrier substrate of claim 12, wherein applying underfill material into the gap between the microelectronic die and the carrier substrate surrounding the first and second interconnect materials with the underfill material comprises applying underfill material into the gap between the microelectronic die and the carrier substrate surrounding the first and second interconnect materials with the underfill material and curing the underfill material at a temperature to effect a predetermined amount of diffusion between the first and second interconnect materials to effect a change in the melting temperature of a predetermined portion of the second interconnect material.

18. The method for interconnecting a microelectronic die and carrier substrate of claim 12, wherein depositing a reflowable electrically conductive first interconnect material comprises depositing a material selected from the group consisting of: Sn-3.5Ag, Sn-5Sb, Sn—Cu, and Sn—Ag—Cu.

19. The method for interconnecting a microelectronic die and carrier substrate of claim 12, wherein depositing a reflowable electrically conductive second interconnect material comprises depositing a material selected from the group consisting of: Sn-35In and Sn-40Bi.

20. The method for interconnecting a microelectronic die and carrier substrate of claim 12, wherein depositing a reflowable electrically conductive first interconnect material comprises depositing Sn on the land pads having a reflow height of 55 $\mu$m, and wherein depositing a reflowable electrically conductive second interconnect material comprises depositing Sn-35In on the bond pads having a reflow height of 20 $\mu$m; and wherein reflowing the second interconnect material at a temperature below the melt temperature of the first interconnect material comprises reflowing the second interconnect material at 180 C.

21. The method for interconnecting a microelectronic die and carrier substrate of claim 12, wherein depositing a reflowable electrically conductive first interconnect material comprises depositing Sn on the land pads having a reflow height of 55 $\mu$m, and wherein depositing a reflowable electrically conductive second interconnect material comprises depositing Sn—40Bi on the bond pads having a reflow height of 20 $\mu$m; and wherein reflowing the second interconnect material at a temperature below the melt temperature of the first interconnect material comprises reflowing the second interconnect material at 180 C.

22. A method for making a microelectronic package, comprising:

depositing a reflowable electrically conductive first interconnect material onto each land pad of the microelectronic die;

reflowing the first interconnect material onto the first land pads;

depositing a reflowable electrically conductive second interconnect material onto each bond pad of the carrier substrate, the second interconnect material having a reflow temperature below the melting temperature of the first interconnect material;

positioning the first interconnect material of each land pad onto the second interconnect material of corresponding bond pads;

reflowing the second interconnect material at a temperature below the melt temperature of the first interconnect material;

applying underfill material into the gap between the microelectronic die and the carrier substrate surrounding the first and second interconnect materials with the underfill material; and processing the first and second interconnect materials in a thermal environment to effect a predetermined amount of diffusion between the first and second interconnect materials to effect a change in the melting temperature of a predetermined portion of the second interconnect material.

23. The method for making a microelectronic package of claim 22, further comprising:

interconnecting additional microelectronic packaging components in a reflow process wherein the first and second interconnect materials intermix to form a hybrid material having a higher melting temperature than that of the second interconnect material, the hybrid material interconnecting the microelectronic die and the carrier substrate.

24. The method for making a microelectronic package of claim 22, wherein depositing a reflowable electrically conductive first interconnect material comprises depositing a material selected from the group consisting of: Sn-3.5Ag, Sn-5Sb, Sn—Cu, and Sn—Ag—Cu; and wherein depositing a reflowable electrically conductive second interconnect material comprises depositing a material selected from the group consisting of: Sn-35In and Sn-40Bi.

25. The method for making a microelectronic package of claim 22, wherein depositing a reflowable electrically conductive first interconnect material comprises depositing Sn on the land pads having a reflow height of 55 $\mu$m, and wherein depositing a reflowable electrically conductive second interconnect material comprises depositing Sn-35In on the bond pads having a reflow height of 20 $\mu$m;

and wherein reflowing the second interconnect material at a temperature below the melt temperature of the first interconnect material comprises reflowing the second interconnect material at 180 C.

26. The method for making a microelectronic package of claim 22, wherein depositing a reflowable electrically conductive first interconnect material comprises depositing Sn on the land pads having a reflow height of 55 $\mu$m, and wherein depositing a reflowable electrically conductive second interconnect material comprises depositing Sn-40Bi on the bond pads having a reflow height of 20 $\mu$m; and wherein reflowing the second interconnect material at a temperature below the melt temperature of the first interconnect material comprises reflowing the second interconnect.

* * * * *

UNITED STATES PATENT AND TRADEMARK OFFICE
CERTIFICATE OF CORRECTION

PATENT NO.     : 6,857,557 B2
DATED          : February 22, 2005
INVENTOR(S)    : Hua It is certified that error appears in the above-identified patent and that said Letters Patent is hereby corrected as shown below:

Column 14,
Line 9, "...interconnect." should read -- ...inconnect material at 180 C. --.

Signed and Sealed this

Twenty-fourth Day of January, 2006

JON W. DUDAS
*Director of the United States Patent and Trademark Office*